US009460650B2

(12) United States Patent
Hong

(10) Patent No.: US 9,460,650 B2
(45) Date of Patent: Oct. 4, 2016

(54) ORGANIC LIGHT-EMITTING DISPLAY

(71) Applicant: SAMSUNG DISPLAY CO., LTD., Yongin, Gyeonggi-Do (KR)

(72) Inventor: Sang-Min Hong, Yongin (KR)

(73) Assignee: SAMSUNG DISPLAY CO., LTD., Yongin, Gyunggi-do (KR)

( * ) Notice: Subject to any disclaimer, the term of this patent is extended or adjusted under 35 U.S.C. 154(b) by 120 days.

(21) Appl. No.: 14/207,829

(22) Filed: Mar. 13, 2014

(65) Prior Publication Data

US 2014/0319486 A1 Oct. 30, 2014

(30) Foreign Application Priority Data

Apr. 24, 2013 (KR) .................... 10-2013-0045618

(51) Int. Cl.
*G09G 3/32* (2016.01)
*H01L 27/32* (2006.01)

(52) U.S. Cl.
CPC ........ *G09G 3/32* (2013.01); *G09G 2300/0443* (2013.01); *G09G 2330/08* (2013.01); *G09G 2330/10* (2013.01); *H01L 27/3218* (2013.01)

(58) Field of Classification Search
None
See application file for complete search history.

(56) References Cited

U.S. PATENT DOCUMENTS

| 6,327,008 | B1 | 12/2001 | Fujiyoshi | |
|---|---|---|---|---|
| 7,956,531 | B2 * | 6/2011 | Smith | H01L 27/3204 313/505 |
| 8,680,518 | B2 * | 3/2014 | Kim | H01L 27/3213 257/40 |
| 8,692,742 | B2 * | 4/2014 | Tsai | G09G 3/3233 315/169.1 |
| 2005/0151462 | A1 | 7/2005 | Miyagawa | |
| 2009/0315874 | A1 | 12/2009 | Kim | |
| 2014/0284570 | A1 * | 9/2014 | Jinta | H01L 27/3218 257/40 |

FOREIGN PATENT DOCUMENTS

| KR | 10-0210822 B1 | 4/1999 |
|---|---|---|
| KR | 10-0669728 B1 | 1/2007 |
| KR | 10-0952814 B1 | 4/2010 |
| KR | 10-1090880 B1 | 12/2011 |
| KR | 10-2012-0041510 A | 5/2012 |

* cited by examiner

*Primary Examiner* — Nicholas Lee
*Assistant Examiner* — Duane N Taylor, Jr.
(74) *Attorney, Agent, or Firm* — Lee & Morse, P.C.

(57) ABSTRACT

An organic light-emitting display includes first sub-pixels of a first color and second sub-pixels of a second color. Pairs of the first sub-pixels are consecutively arranged in different rows, and pairs of the second sub-pixels are consecutively arranged in different rows. The pairs of first sub-pixels and the pairs of second sub-pixels arranged alternately in a first column, and third sub-pixels are in a second column adjacent to the first column. When one sub-pixel is defective, a control circuit provides current another sub-pixel of the same color.

19 Claims, 13 Drawing Sheets

ORGANIC LIGHT-EMITTING DISPLAY

CROSS-REFERENCE TO RELATED APPLICATION

Korean Patent Application No. 10-2013-0045618, filed on Apr. 24, 2013, and entitled, "ORGANIC LIGHT-EMITTING DISPLAY," is incorporated by reference herein in its entirety.

BACKGROUND

1. Field

One or more embodiments described herein relate to a display device.

2. Description of the Related Art

An organic light-emitting display emits light using organic light-emitting diodes (OLEDs). In an OLED, fine particles and substances may contaminate an organic layer between the anode and cathode electrodes. As a result, a short may form between the anode and cathode electrodes, or a shadow phenomenon may occur by organic layer deposition. These defects may adversely affect performance of the pixels including the formation of dark pixels.

SUMMARY

In accordance with one embodiment, an organic light-emitting display includes first sub-pixels of a first color and second sub-pixels of a second color, pairs of the first sub-pixels arranged consecutively in different rows and pairs of the second sub-pixels arranged consecutively in different rows, the pairs of first sub-pixels and the pairs of second sub-pixels arranged alternately in a first column; and third sub-pixels in a second column adjacent to the first column. Each of the first sub-pixels and each of the second sub-pixels in the first row include a light-emitting diode which includes multiple anode electrodes and a common cathode electrode; a pixel circuit to supply current to the light-emitting diode; and a switch circuit between the pixel circuit and light-emitting diode, the switch circuit to selectively deliver the current to at least one of a light-emitting diode in the first row and a light-emitting diode in a second row adjacent to the first row.

The switch circuit may include a first switch circuit to connect a pixel circuit in the first row with the light-emitting diode in the first row, and a second switch circuit to connect the pixel circuit in the first row with the light-emitting diode in the second row.

The first switch circuit may include multiple switches connected to the pixel circuit in the first row and multiple anode electrodes in the first row, and the second switch circuit may include multiple switches connected to the pixel circuit in the first row and multiple anode electrodes in the second row. The multiple switching elements are PMOS transistors or NMOS transistors.

The multiple anode electrodes may include first and second anode electrodes, and the light-emitting diode may include a first light-emitting diode which includes the first anode electrode and a common cathode electrode, and a second light-emitting diode which includes the second anode electrode and the common cathode electrode.

When the first light-emitting diode of the first sub-pixel in the first row is defective, the second light-emitting diode in the first row and one of the first light-emitting diode or the second light-emitting diode of the first sub-pixel in the second row may be controlled to emit light at a same time.

When both the first light-emitting diode and the second light-emitting diode of the first sub-pixel in the first row are defective, the first light-emitting diode and the second light-emitting diode of the first sub-pixel in the second row may emit light at the same time via the second switch unit in the first row. The second row may be adjacent the first row.

The third sub-pixel may have a height that is substantially twice or more than a height of the first sub-pixel or the second sub-pixel in a column direction. The first sub-pixel may emit red light, the second sub-pixel may emit green light, and the third sub-pixel may emit blue light.

In accordance with another embodiment, an organic light-emitting display includes a sub-pixel which includes: a first light-emitting diode having multiple first anode electrodes and a first common cathode electrode; a first pixel circuit to supply current to the first light-emitting diode; a first switch circuit to selectively deliver the current supplied from the first pixel circuit to the multiple first anode electrodes; and a second switch circuit to selectively deliver the current supplied from the first pixel circuit to multiple second anode electrodes that form a second light-emitting diode in an adjacent second row, wherein the first light-emitting diode receives the current supplied from the first pixel circuit or the current supplied from a second pixel circuit in the second row and emits light.

The display may further include first sub-pixels of a first color, pairs of the first sub-pixels may be arranged consecutively in different rows; second sub-pixels of a second color, pairs of the second sub-pixels may be arranged consecutively in different rows, the pairs of first sub-pixels and the pairs of second sub-pixels may be arranged alternately in a first column; and third sub-pixels may be arranged in a second column adjacent to the first column, wherein the sub-pixel is the first sub-pixel or the second sub-pixel.

The first switch circuit may include multiple switching elements connected to the first pixel circuit and the multiple first anode electrodes, and the second switch circuit may include multiple switching elements connected to the first pixel circuit and the multiple second anode electrodes. The multiple switching elements may be PMOS or NMOS transistors. The second row may be adjacent the first row.

When one of the multiple first anode electrodes is defective, a switch connected to another anode electrode among the multiple first anode electrodes and a switch connected to one of the multiple second anode electrodes may be turned on to distribute the current from the first pixel circuit to the respective anode electrodes. When all of the multiple first anode electrodes are defective, switches connected to the multiple first anode electrodes are turned off and switches connected to the multiple second anode electrodes may be turned on, to distribute the current from the first pixel circuit to the multiple second anode electrodes. The first sub-pixel may emit red light, the second sub-pixel may emit green light, and the third sub-pixel may emit blue light.

In accordance with another embodiment, a display device includes a plurality of first light emitters, a plurality of second light emitters, and a control circuit to provide current to a first one of the second light emitters when a first one of the first light emitters is defective. The pluralities of first and second light emitters correspond to a same pixel. The control circuit may provide current to a second one of the first light emitters when the second one of the first light emitters is not defective, and the second one of the first light emitters and the first one of the second light emitters may emit light at a same time.

The plurality of first light emitters may correspond to a same sub-pixel. Each of the first light emitters may emit light of a first color. The plurality of second light emitters may correspond to a same sub-pixel, and wherein each of the second light emitters emit light of the first color. Each of the light emitters may include an organic light emitting diode.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
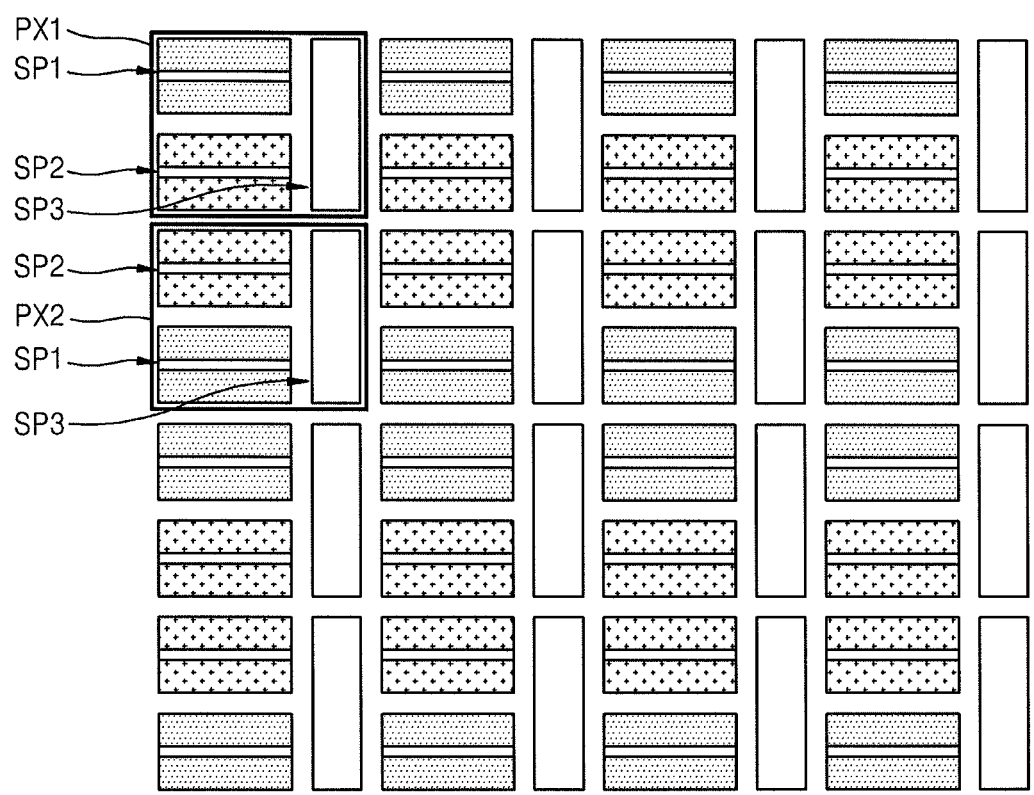
FIG. 1 illustrates an embodiment of a pixel arrangement for an OLED display.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates an embodiment of a pixel arrangement for an organic light-emitting display. Referring to FIG. 1, the pixel arrangement includes a plurality of first unit pixels PX1 and a plurality of second unit pixels PX2. Each of the unit pixels includes a plurality of sub-pixels SP1, SP2, and SP3. The sub-pixels are repetitively arranged alternately in a column direction, and the same unit pixels PX1 and PX2 are repetitively arranged in a row direction.

The first sub-pixel SP1 emits light in a first color, the second sub-pixel SP2 emits light in a second color, and the third sub-pixel SP3 emits light in a third color. The first sub-pixel SP1 and the second sub-pixel SP2 may have a same size, and may be located in left columns or right columns. In FIG. 1, the first and second sub-pixels SP1 and SP2 are illustratively shown at left columns of unit pixels PX1 and PX2. The third sub-pixel SP3 may have a height that is twice that of the first sub-pixel SP1 or the second sub-pixel SP2 in the column direction. Also, the third sub-pixels SP3 may be located in right columns or left columns of the unit pixels PX1 and PX2. In FIG. 1, the third sub-pixel SP3 are illustratively shown in the right columns of unit pixels PX1 and PX2. The first and second sub-pixels SP1 and SP2 may have first widths in the row direction, and the third sub-pixel SP3 may have a second width smaller than the first width in the row direction.

The first and second sub-pixels SP1 and SP2 are arranged alternately in the same column. The first and third sub-pixels SP1 and SP3 are repetitively arranged in the row direction with the third sub-pixel SP3 therebetween. Two first sub-pixels SP1 and two second sub-pixels SP2 may be arranged consecutively in different rows and alternately in the same column. The first sub-pixels SP1 and the second sub-pixels SP2 may be divided into a plurality of sections. In FIG. 1, the first and second sub-pixels are divided into two sections, which are independently driven and emit light.

Figure 2:
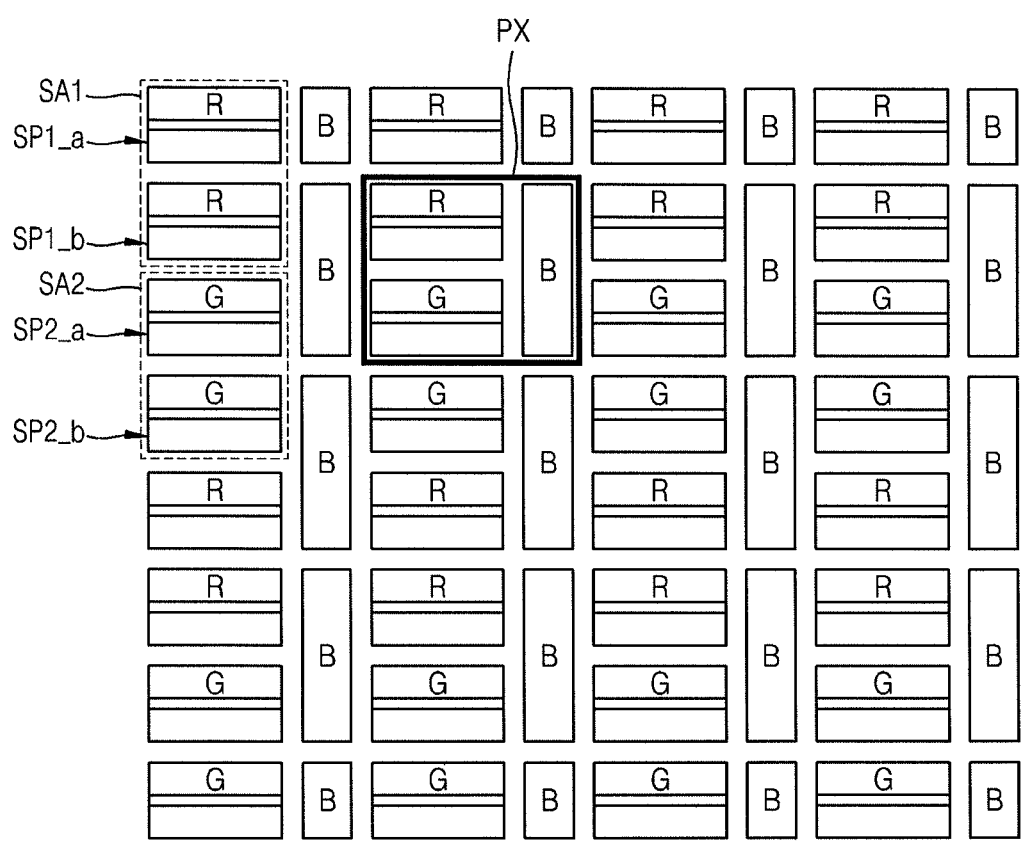
FIG. 2 illustrates an example of color arrangement for a unit pixel in FIG. 1.

FIG. 2 illustrates an example of color arrangement of unit pixels in FIG. 1. In this color arrangement, the first sub-pixel SP1 is a red sub-pixel R, the second sub-pixel SP2 is a green sub-pixel G, and the third sub-pixel SP3 is a blue sub-pixel B. A first unit region SA1 includes two consecutive red sub-pixels R and a second unit region SA2 includes two consecutive green sub-pixels G. These regions are alternately arranged in the column direction. That is, the first unit region SA1 includes a sub-pixel SP1_$a$ of an $n^{th}$ row and a sub-pixel SP1_$b$ of an $(n+1)^{th}$ row, and the second unit region SA2 includes a sub-pixel SP2_$a$ of an $(n+1)^{th}$ row and a sub-pixel SP2_$b$ of the $(n+2)^{th}$ row. Each of the sub-pixel SP1_$a$, sub-pixel SP1_$b$, sub-pixel SP2_$a$, and sub-pixel SP2_$b$ may have a dual-division structure.

Figure 3:
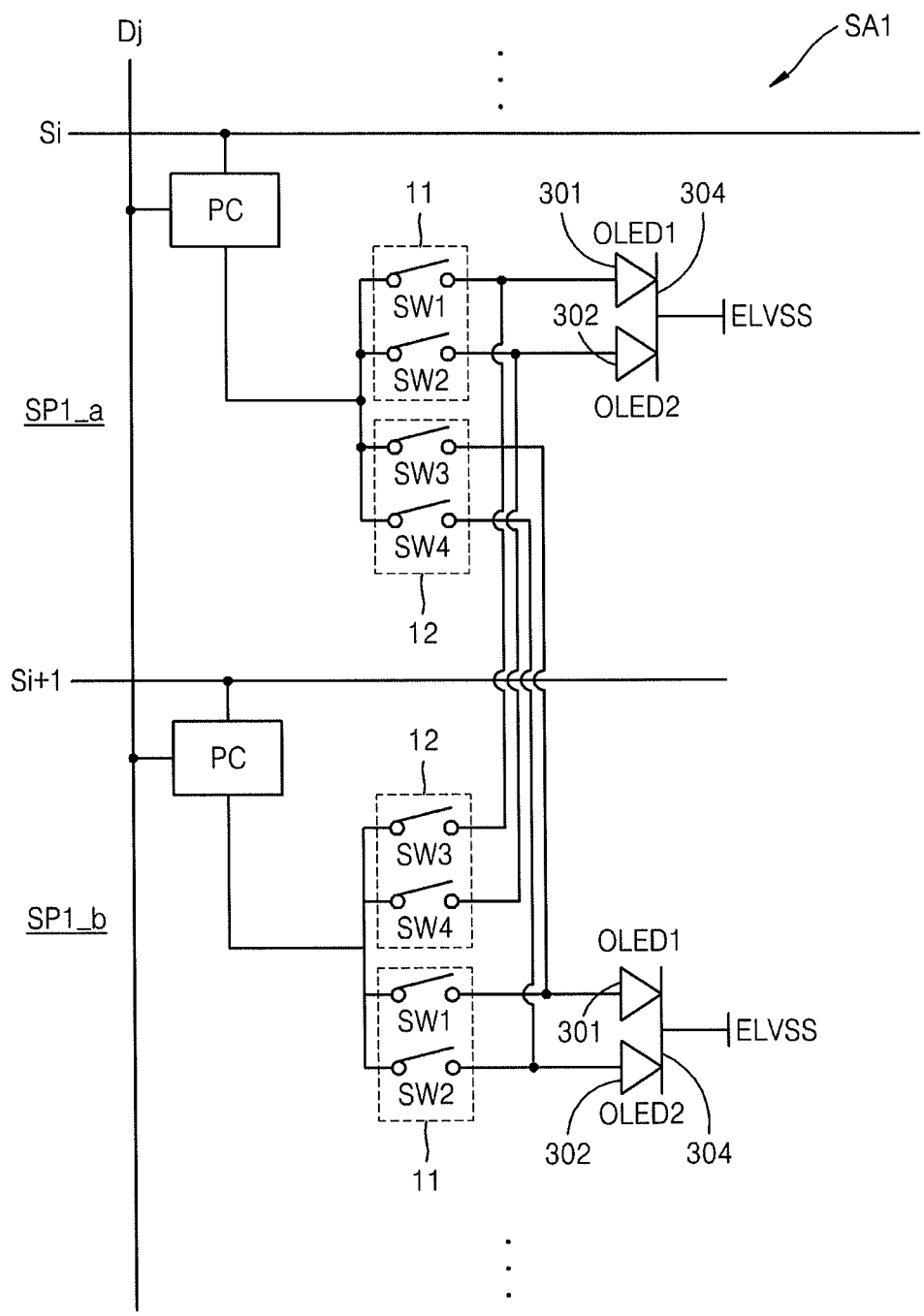
FIG. 3 illustrates an embodiment of a first unit region of FIG. 2.
Figure 4:
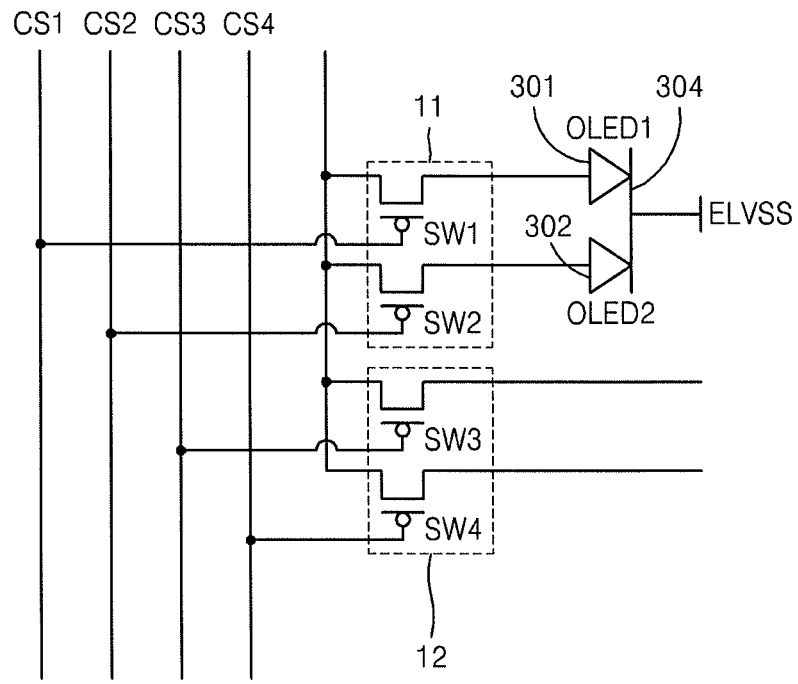
FIGS. 4 and 5 illustrate an embodiment of a switch unit in FIG. 3.
Figure 5:
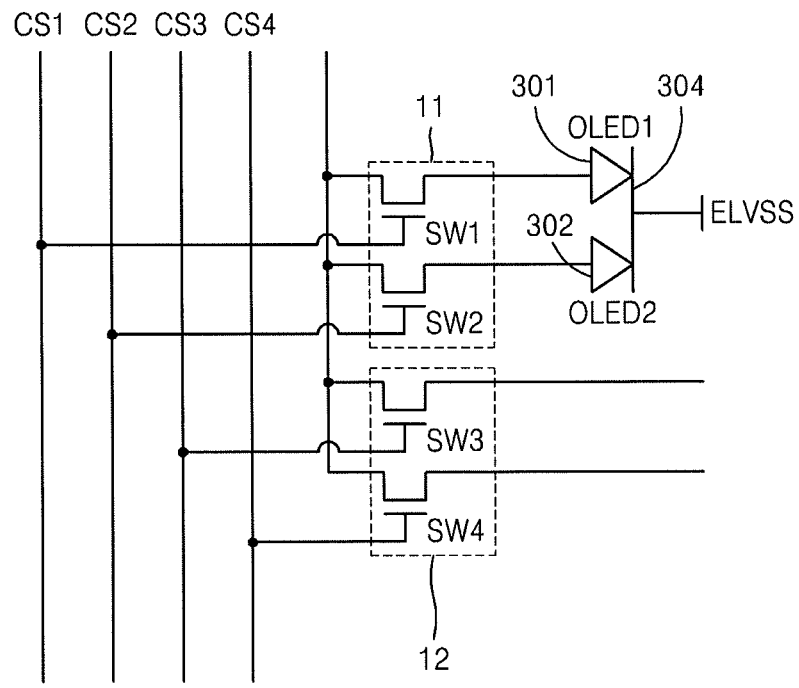

FIG. 3 illustrates an embodiment of the first unit region SA1 of FIG. 2. FIGS. 4 and 5 illustrate an embodiment of a switch unit in FIG. 3. The embodiment of the first unit region SA1 in FIG. 3 may be equally applied to the second unit region SA2.

Referring to FIG. 3, in the first unit region SA1, two first sub-pixels SP1_$a$ and SP1_$b$, which are red sub-pixels R, are connected to two adjacent scan lines SLi and SLi+1, respectively.

Each of the sub-pixel SP1_$a$ and the sub-pixel SP1_$b$ includes a pixel circuit (PC) and an organic light-emitting diode (OLED) connected to the pixel circuit (PC). The OLED may include a plurality of anode electrodes and one common cathode electrode. In the embodiment of FIG. 3, each OLED includes two anode electrodes 301 and 302 and one common cathode electrode 304, and a first OLED OLED1 and a second OLED OLED2 are provided. The cathode electrode 304 is connected to a second power voltage ELVSS. The pixel circuit (PC) controls the amount of current supplied to the OLED to correspond to a data signal Dj on a data line DLj, when scan signals Si and Si+1 are provided to scan lines SLi and SLi+1, respectively. The pixel circuit (PC) may include at least one thin film transistor (TFT) and a capacitor.

Each of the sub-pixel SP1_$a$ and the sub-pixel SP1_$b$ includes a first switch unit 11 and a second switch unit 12. The first and second switch units are between the pixel circuits PC and the OLEDs OLED1 and OLED2. The first switch unit 11 includes a first switching element SW1 and a second switching element SW2 connected between pixel circuit PC and OLEDs OLED1 and OLED2 in a row. The second switch unit 12 includes a third switching element SW3 and a fourth switching element SW4, which are connected between the pixel circuit PC in the current row and the OLEDs OLED1 and OLED2 in an adjacent previous or next row.

The first switching element SW1 and the second switching element SW2 of the sub-pixel SP1_a are connected to two anode electrodes 301 and 302 of the sub-pixel SP1_a, respectively. The third switching element SW3 and the fourth switching element SW4 of the sub-pixel SP1_a are connected to two anode electrodes 301 and 302 of the sub-pixel SP1_b, respectively.

If a defect or a failure (e.g., due to a short) occurs between at least one of the two anode electrodes 301 and 302 of the sub-pixel SP1_a and the cathode electrode 304, the corresponding anode electrode and the pixel circuit PC of the sub-pixel SP1_a are separated from each other by the first switch unit 11. Also, the pixel circuit PC of the sub-pixel SP1_a is connected to at least one of the two anode electrodes 301 and 302 of the sub-pixel SP1_b by the second switch unit 12.

The first switching element SW1 and the second switching element SW2 of the sub-pixel SP1_b are connected to the two anode electrodes 301 and 302 of the sub-pixel SP1_b, respectively. The third switching element SW3 and the fourth switching element SW4 of the sub-pixel SP1_b are connected to the two anode electrodes 301 and 302 of the sub-pixel SP1_a, respectively. The first switch unit 11 and the second switch unit 12 may include PMOS transistors as illustrated in FIG. 4 or NMOS transistors as illustrated in FIG. 5.

The first switching element SW1 is turned on or off by a first control signal CS1 from a first control line. Once the first switching element SW1 is turned on, current supplied from the pixel circuit PC in the corresponding row is supplied to the first anode electrode 301 of the first OLED OLED1 in the row.

The second switching element SW2 is turned on or off by a second control signal CS2 from a second control line. Once the second switching element SW2 is turned on, current supplied from the pixel circuit PC in the corresponding row is supplied to the second anode electrode 302 of the second OLED OLED2 in the row.

The third switching element SW3 is turned on or off by a third control signal CS3 from a third control line. Once the third switching element SW3 is turned on, current supplied from the pixel circuit PC in the corresponding row is supplied to the first anode electrode 301 of the first OLED OLED1 in an adjacent (e.g., previous or next) row.

The fourth switching element SW4 is turned on or off by a fourth control signal CS4 from a fourth control line. Once the fourth switching element SW4 is turned on, current supplied from the pixel circuit PC in the corresponding row is supplied to the second anode electrode 302 of the second OLED OLED2 in an adjacent (e.g., previous or next) row.

Figure 6:
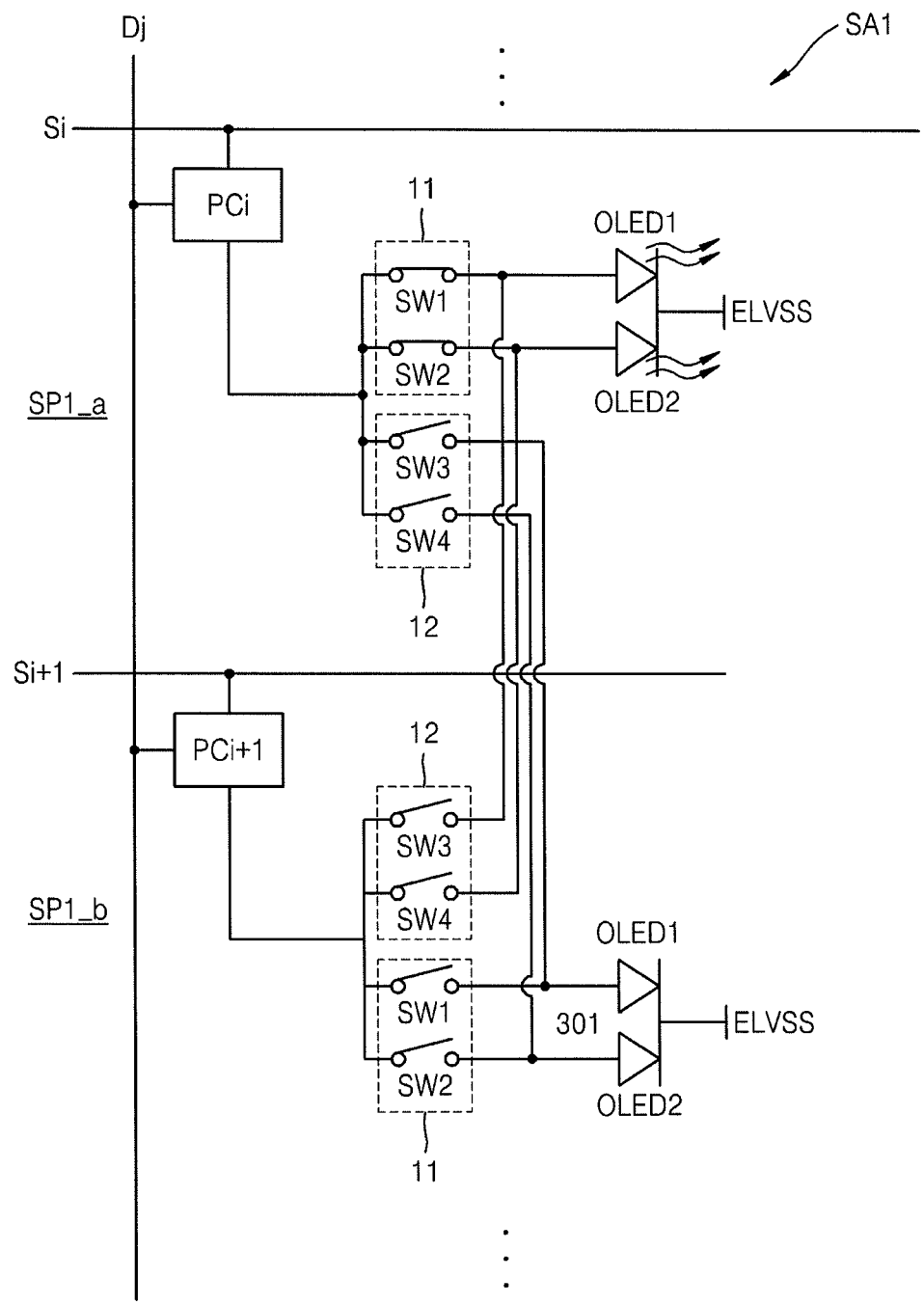
FIGS. 6 and 7 illustrate one embodiment of a driving method for an organic light-emitting diode (OLED) of a sub-pixel in a normal state.
Figure 7:
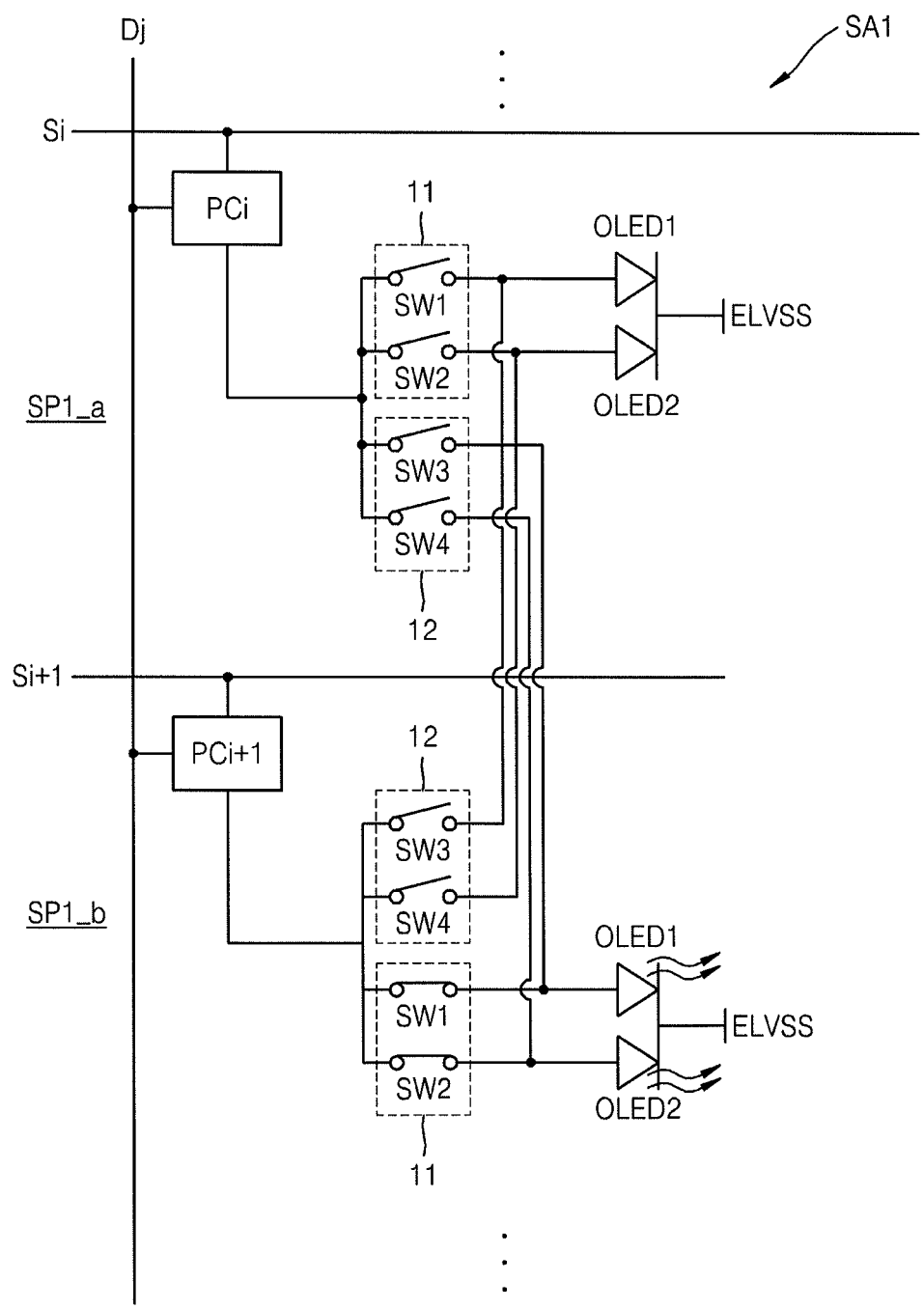

FIGS. 6 and 7 illustrate an embodiment of a driving method when the OLED of each sub-pixel is normal, e.g., not defective. Referring to FIG. 6, if scan signal Si is provided to the $i^{th}$ scan line, data signal Dj is provided to pixel circuit PCi of sub-pixel SP1_a through the $j^{th}$ data line. The third switching element SW3 and the fourth switching element SW4 are turned off by the third control signal SC3 and the fourth control signal SC4, respectively. The first switching element SW1 and the second switching element SW2 are turned on by the first control signal SC1 and the second control signal SC2, respectively. Current from the pixel circuit PCi is distributed to the first OLED OLED1 and the second OLED OLED2. Thus, OLED1 and OLED2 of sub-pixel SP1_a emit light at the same time.

Referring to FIG. 7, once a scan signal (Si+1) is provided to an $(i+1)^{th}$ scan line, data signal Dj is provided to pixel circuit PCi+1 of sub-pixel SP1_b through the $j^{th}$ data line. The third switching element SW3 and the fourth switching element SW4 are turned off by the third control signal SC3 and the fourth control signal SC4, respectively. The first switching element SW1 and the second switching element SW2 are turned on by the first control signal SC1 and the second control signal SC2, respectively. Current from pixel circuit PCi+1 is distributed to the first OLED OLED1 and the second OLED OLED2. Thus, OLED1 and OLED2 of sub-pixel SP1_b emit light at the same time.

Figure 8:
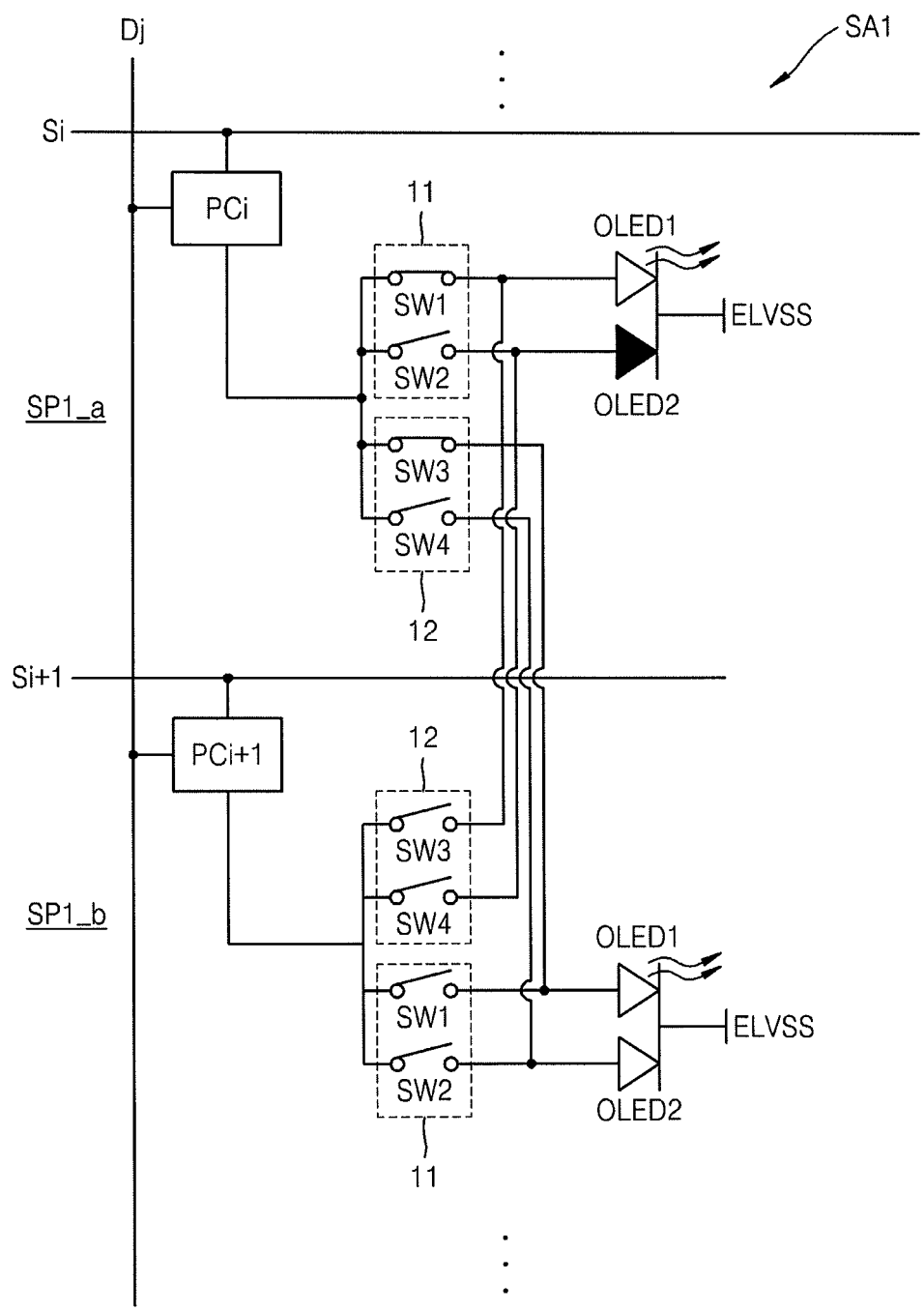
FIGS. 8 and 9 illustrate an embodiment of a driving method for an OLED display when some OLEDs of a particular sub-pixel are defective.
Figure 9:
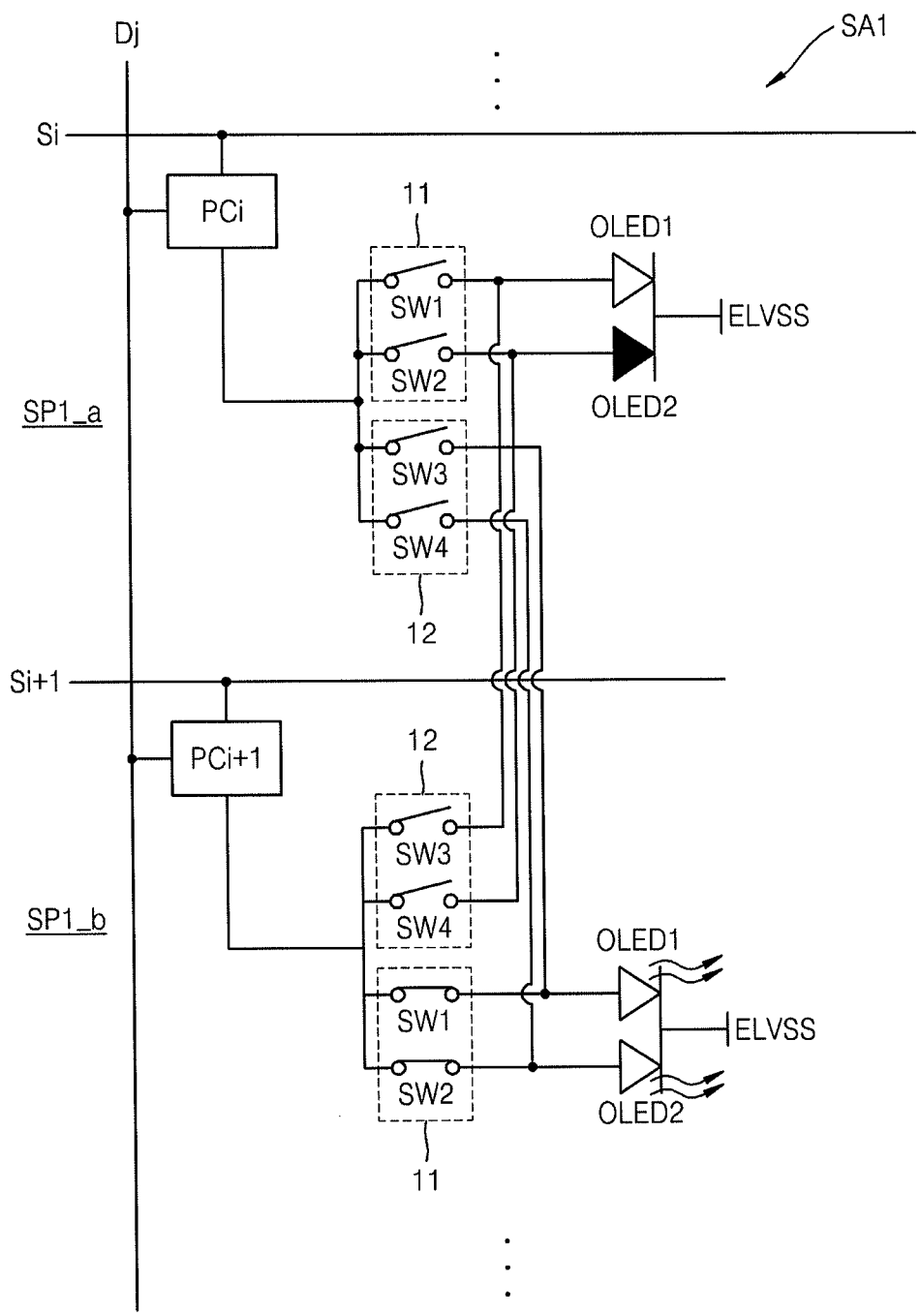

FIGS. 8 and 9 illustrate an embodiment of a driving method when some (e.g., fewer than all) OLEDs of a particular sub-pixel is defective. In FIGS. 8 and 9, the second OLED OLED2 of the sub-pixel SP1_a in the $i^{th}$ row is defective.

Referring to FIG. 8, once scan signal Si is provided to the $i^{th}$ scan line, data signal Dj is provided to pixel circuit PCi of sub-pixel SP1_a through the $j^{th}$ data line. The second switching element SW2 and the fourth switching element SW4 are turned off by the second control signal SC2 and the fourth control signal SC4, respectively. The first switching element SW1 and the third switching element SW3 are turned on by the first control signal SC1 and the third control signal SC3, respectively. Current from the pixel circuit PCi is distributed to the first OLED OLED1 of the sub-pixel SP1_a and the first OLED OLED1 of the sub-pixel SP1_b. Thus, OLED1 of sub-pixel SP1_a and OLED1 of sub-pixel SP1_b emit light at the same time.

According to another example, the fourth switching element SW4 may be turned on in place of the third switching element SW3, such that OLED1 of sub-pixel SP1_a and OLED2 of sub-pixel SP1_b emit light at the same time.

Referring to FIG. 9, once scan signal (Si+1) is provided to the $(i+1)^{th}$ scan line, data signal Dj is provided to pixel circuit PCi+1 of sub-pixel SP1_b through the $j^{th}$ data line. Since the first and second OLEDs OLED1 and OLED2 of sub-pixel SP1_b are normal (e.g., not defective), the third switching element SW3 and the fourth switching element SW4 are turned off by the third control signal SC3 and the fourth control signal SC4, respectively. The first switching element SW1 and the second switching element SW2 are turned on by the first control signal SC1 and the second control signal SC2, respectively. Current from pixel circuit PCi+1 is distributed to the first OLED OLED1 and the second OLED OLED2. Thus, OLED1 and OLED2 of sub-pixel SP1_b emit light at the same time.

Figure 10:
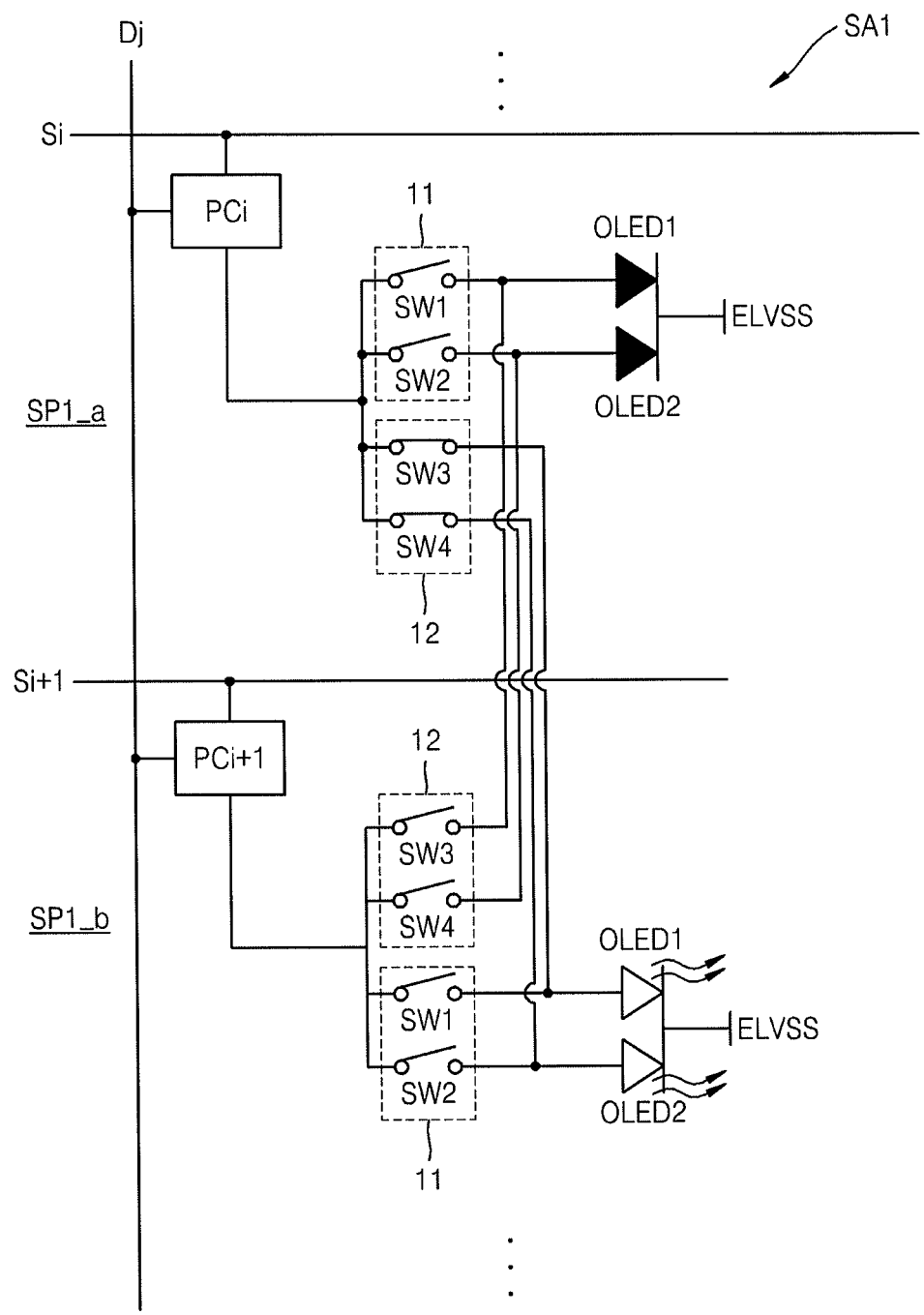
FIGS. 10 and 11 illustrate an embodiment of a driving method for an OLED display when all OLEDs of a particular sub-pixel are defective.
Figure 11:
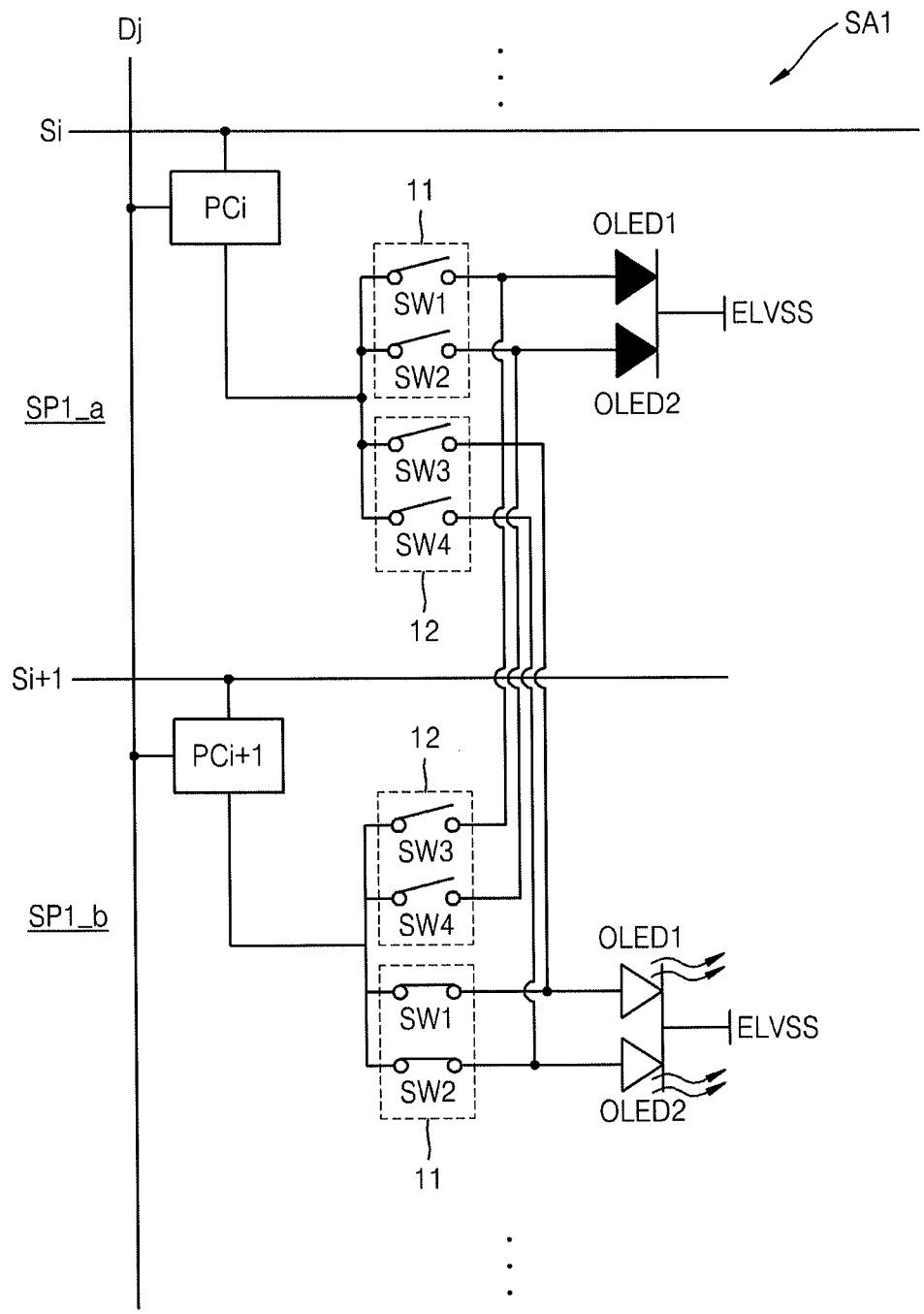

FIGS. 10 and 11 illustrate an embodiment of a driving method when all OLEDs of a particular sub-pixel are defective. In FIGS. 10 and 11, both OLED1 and OLED2 of sub-pixel SP1_a in the $i^{th}$ row are defective.

Referring to FIG. 10, once scan signal Si is provided to the $i^{th}$ scan line, data signal Dj is provided to pixel circuit PCi of sub-pixel SP1_a through the $j^{th}$ data line. The first switching element SW1 and the second switching element SW2 are turned off by the first control signal SC1 and the second control signal SC2, respectively. The third switching element SW3 and the fourth switching element SW4 are turned on by the third control signal SC3 and the fourth control signal SC4, respectively. Current from pixel circuit PCi is distributed to the first OLED OLED1 and the second OLED OLED2 of sub-pixel SP1_b. Thus, OLED1 and OLED2 of sub-pixel SP1_b emit light at the same time.

Referring to FIG. 11, once scan signal (Si+1) is provided to the (i+1)$^{th}$ scan line, data signal Dj is provided to pixel circuit PCi+1 of the sub-pixel SP1_b through the j$^{th}$ data line. Since the anode electrodes of sub-pixel SP1_b are normal (e.g., not defective), the third switching element SW3 and the fourth switching element SW4 are turned off by the third control signal SC3 and the fourth control signal SC4, respectively. The first switching element SW1 and the second switching element SW2 are turned on by the first control signal SC1 and the second control signal SC2, respectively. Current from pixel circuit PCi+1 is distributed to the first OLED OLED1 and the second OLED OLED2. Thus, OLED1 and OLED2 of sub-pixel SP1_b emit light at the same time.

Figure 12:
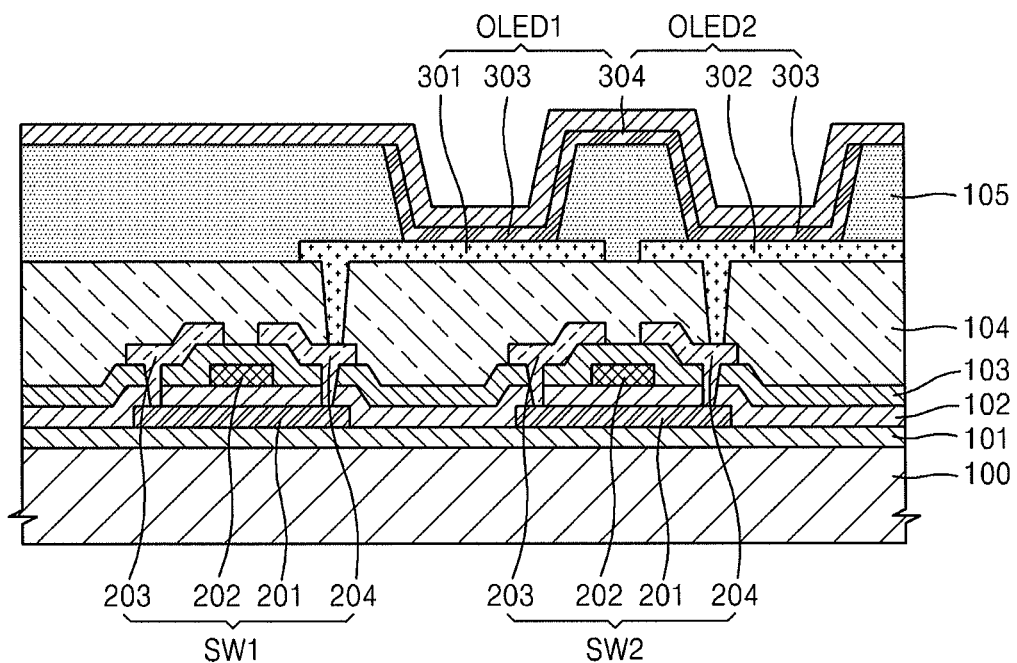
FIG. 12 illustrates an embodiment of a sub-pixel.

FIG. 12 is a cross-sectional view of an embodiment of a sub-pixel. The sub-pixel in FIG. 12 may correspond to the first sub-pixel SP1 or the second sub-pixel SP2.

Referring to FIG. 12, a pixel circuit PC (including multiple TFTs and a capacitor), OLEDs, and multiple switching elements SW are formed on a buffer layer 101 of a substrate 100 to configure a sub-pixel. The multiple switching elements SW control current supply from pixel circuit PC between the pixel circuit PC and the OLEDs. In FIG. 12, only cross-sections of the OLEDs and the first switching element SW1 and the second switching element SW2 (connected to anode electrodes of the OLEDs) are illustrated.

More specifically, the buffer layer 101 is formed on substrate 100, and active layers 201 of the first switching element SW1 and the second switching element SW2 are formed. The buffer layer 101 may be selectively formed. The active layers 201 may be formed of a semiconductor material that may include an oxide semiconductor material. The active layers 201 include source/drain regions and a channel region between the source region and the drain region.

A gate insulating layer 102 is deposited on the active layers 201 and the buffer layer 101. A gate electrode material is deposited on the gate insulating layer 102 and patterned to form gate electrodes 202 of the first switching element SW1 and the second switching element SW2.

An interlayer insulating layer 103 is deposited on the gate electrodes 202 and the gate insulating layer 102. Source/drain electrode materials are deposited on interlayer insulating layer 103 and patterned to form source/drain electrodes 203 and 204 connected with the source/drain regions of the active layers 201.

Next, after a planarization layer 104 is deposited on substrate 100, a pixel electrode material is deposited on the planarization layer 104 and patterned to form the first anode electrode 301 and the second anode electrode 302. The first anode electrode 301 is connected to one of the source/drain electrodes 203 and 204 of the first switching element SW1 through a via hole. The second anode electrode 302 is connected to one of the source/drain electrodes 203 and 204 of the second switching element SW2 through a via hole.

An insulating layer is deposited on substrate 100 and patterned to form a pixel defining layer 105 having an opening that partially exposes the first anode electrode 301 and the second anode electrode 302.

An organic layer 303 is deposited on the first anode electrode 301 and the second anode electrode 302 that are exposed through the opening. The organic layer 303 may be formed by stacking an emissive layer (EML) and one or more of function layers such as a hole transport layer (HTL), a hole injection layer (HIL), an electron transport layer (ETL), and an electron injection layer (EIL) in a single-layer or multi-layer structure. The organic layer 303 may include a low-molecular or high-molecular organic material.

When the organic layer 303 emits red, green, or blue light, the light-emitting layer may be patterned as a red-light-emitting layer, a green-light-emitting layer, or a blue-light-emitting layer, respectively. When the organic layer 303 emits white light, the white light may have a multi-layer structure in which the red-light-emitting layer, the green-light-emitting layer, and the blue-light-emitting layer are stacked or a single-layer structure including a red-light-emitting material, a green-light-emitting material, and a blue-light-emitting material.

The organic layer 303 may be deposited and patterned on the first anode electrode 301 and the second anode electrode 302, respectively. In one embodiment, the organic layer 303 deposited on the first anode electrode 301 and the second anode electrode 302 may emit the same light. Organic layer 303 may also be stacked on the pixel defining layer 105 between the first anode electrode 301 and the second anode electrode 302 for connection therebetween. Even when the organic layer 303 is formed on the two anode electrodes 301 and 302, the light-emitting layer of the organic layer 303 may have low horizontal conductivity, such that the organic layer 393 may be independently driven for the anode electrodes 301 and 302. Next, the cathode electrode 304 is deposited on the entire surface of substrate 100.

Figure 13:
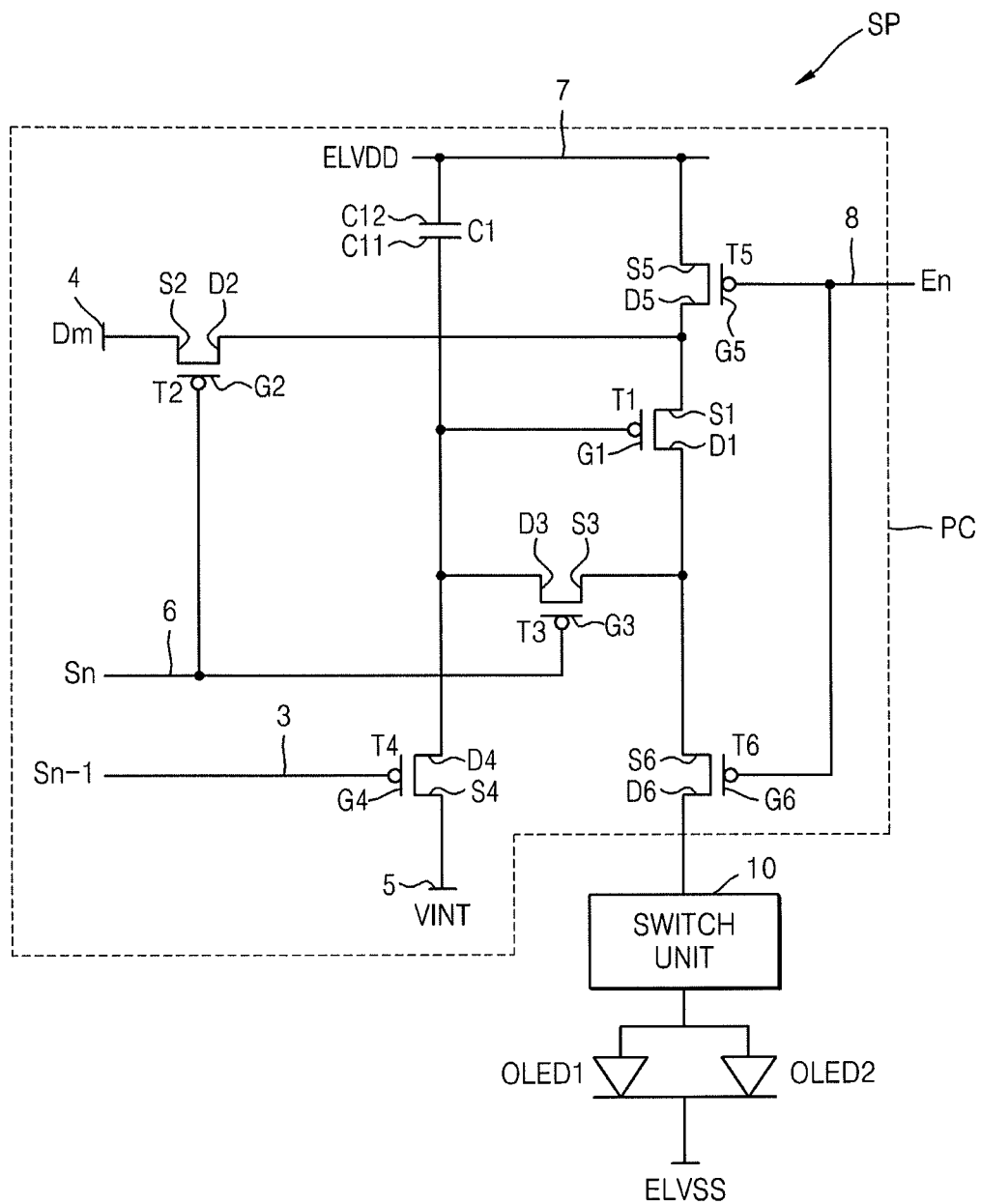
FIGS. 13 and 14 illustrate equivalent circuit diagrams of an embodiment of a sub-pixel.

FIG. 13 is an equivalent circuit diagram of one embodiment of a sub-pixel SP. In FIG. 13, sub-pixel SP may include a pixel circuit PC including first through sixth TFTs T1 through T6 and a first capacitor C1, an OLED that receives driving current through the pixel circuit PC and emits light, and a switch unit 10 that controls flow of the driving current between the pixel circuit PC and the OLED.

The first through sixth TFTs T1 through T6 include a driving TFT T1, a switching TFT T2, a compensation TFT T3, an initialization TFT T4, a first light-emission control TFT T5, and a second light-emission control TFT T6.

Sub-pixel SP may further include a first scan line 6 for delivering a first scan signal Sn to the switching TFT T2 and the compensation TFT T3, a second scan line 3 for delivering a second scan signal Sn-1 (which is a previous scan signal) to the initialization TFT T4, a light-emission control line 8 for delivering a light-emission control signal En to the first light-emission control TFT T5 and the second light-emission control TFT T6, a data line 4 that intersects the first scan line 6 and delivers a data signal Dm, a driving voltage line 7 that delivers a first power voltage ELVDD and is formed in parallel with the data line 4, and an initialization voltage line 5 that delivers an initialization voltage VINT for initializing the driving TFT T1.

A gate electrode G1 of the driving TFT T1 is connected to a first electrode C11 of a first capacitor C1. A source electrode S1 of the driving TFT T1 is connected to the driving voltage line 7 through the first light-emission control TFT T5. A drain electrode D1 of driving TFT T1 is electrically connected to an anode electrode of a corresponding OLED through the second light-emission control TFT T6. The driving TFT T1 receives the data signal Dm and supplies a driving current Ioled to the OLED, according to a switching operation of the switching TFT T2.

A gate electrode G2 of the switching TFT T2 is connected to the first scan line 6. A source electrode S2 of the switching TFT T2 is connected to the data line 4. A drain electrode D2 of the switching TFT T2 is connected to the source electrode S1 of the driving TFT T1, and is also connected to the driving voltage line 7 through the first light-emission control TFT T5. The switching TFT T2 is turned on according to the first scan signal Sn received through the first scan line 6, and performs a switching operation of delivering data signal Dm from data line 4 to source electrode S1 of driving TFT T1.

A gate electrode G3 of the compensation TFT T3 is connected to the first scan line 6. A source electrode S3 of the compensation TFT T3 is connected to the drain electrode D1 of driving TFT T1, and is also connected with the anode electrode of the OLED through the second light-emission control TFT T6. A drain electrode D3 of the compensation TFT T3 is connected with a first electrode C11 of the first capacitor C1, a drain electrode D4 of the initialization TFT T4, and the gate electrode G1 of the driving TFT T1. The compensation TFT T3 is turned on according to the first scan signal Sn received through the first scan line 6 and connects the gate electrode G1 of the driving TFT T1 with the drain electrode D1 of driving TFT T1 for diode-connection of driving TFT T1.

A gate electrode G4 of the initialization TFT T4 is connected to the second scan line 3. A source electrode S4 of the initialization TFT T4 is connected to an initialization voltage line 5. A drain electrode D4 of the initialization TFT T4 is connected to the first electrode C11 of the first capacitor C1, the drain electrode D3 of the compensation TFT T3, and the gate electrode G1 of the driving TFT T1. The initialization TFT T4 is turned on according to the second scan line Sn-1 delivered through the second scan line 3, and performs an initialization operation of delivering the initialization voltage VINT to the gate electrode G1 of driving TFT T1 to initialize a voltage of the gate electrode G1 of the driving TFT T1.

A gate electrode G5 of the first light-emission control TFT T5 is connected to the light-emission control line 8. A source electrode S5 of the first light-emission control TFT T5 is connected to the driving voltage line 7. A drain electrode D5 of the first light-emission control TFT T5 is connected to the source electrode S1 of the driving TFT T1 and the drain electrode D2 of the switching TFT T2.

A gate electrode G6 of the second light-emission control TFT T6 is connected to the light-emission control line 8. A source electrode S6 of the second light-emission control TFT T6 is connected to the drain electrode D1 of the driving TFT T1 and the source electrode S3 of the compensation TFT T3. A drain electrode D6 of the second light-emission control TFT T6 is electrically connected to the anode electrode of the OLED. The first light-emission control TFT T5 and the second light-emission control TFT T6 are simultaneously turned on according to the light-emission control signal En delivered through the light-emission control line 8. As a result, the first power voltage ELVDD is delivered to the OLED, and thus driving current Ioled flows through the OLED.

A second electrode C12 of the first capacitor C1 is connected to the driving voltage line 7. The first electrode C11 of the first capacitor C1 is connected to the gate electrode G1 of the driving TFT T1, the drain electrode D3 of the compensation TFT T3, and the drain electrode D4 of the initialization TFT T4.

The OLEDs include first OLED OLED1 including a first anode electrode and a cathode electrode that is a common electrode, and a second OLED OLED2 including a second anode electrode and the cathode electrode that is the common electrode. The cathode electrode is connected to second power voltage ELVSS. OLED1 and OLED2 selectively receive driving current Ioled via switch unit 10 and are independently driven to display an image.

The switch unit 10 may include a first switch unit and a second switch unit. The first switch unit selectively delivers the driving current Ioled from the pixel circuit PC to the first OLED OLED1 and the second OLED OLED2. The second switch unit selectively delivers the driving current Ioled from the pixel circuit PC to the first OLED OLED1 and the second OLED OLED2 of an adjacent sub-pixel.

The sub-pixel SP in FIG. 13 may be one of a red sub-pixel R or a green sub-pixel G. A blue sub-pixel B may include the same pixel circuit as the pixel circuit PC in FIG. 13 and an OLED including one anode electrode and one cathode electrode.

Figure 14:
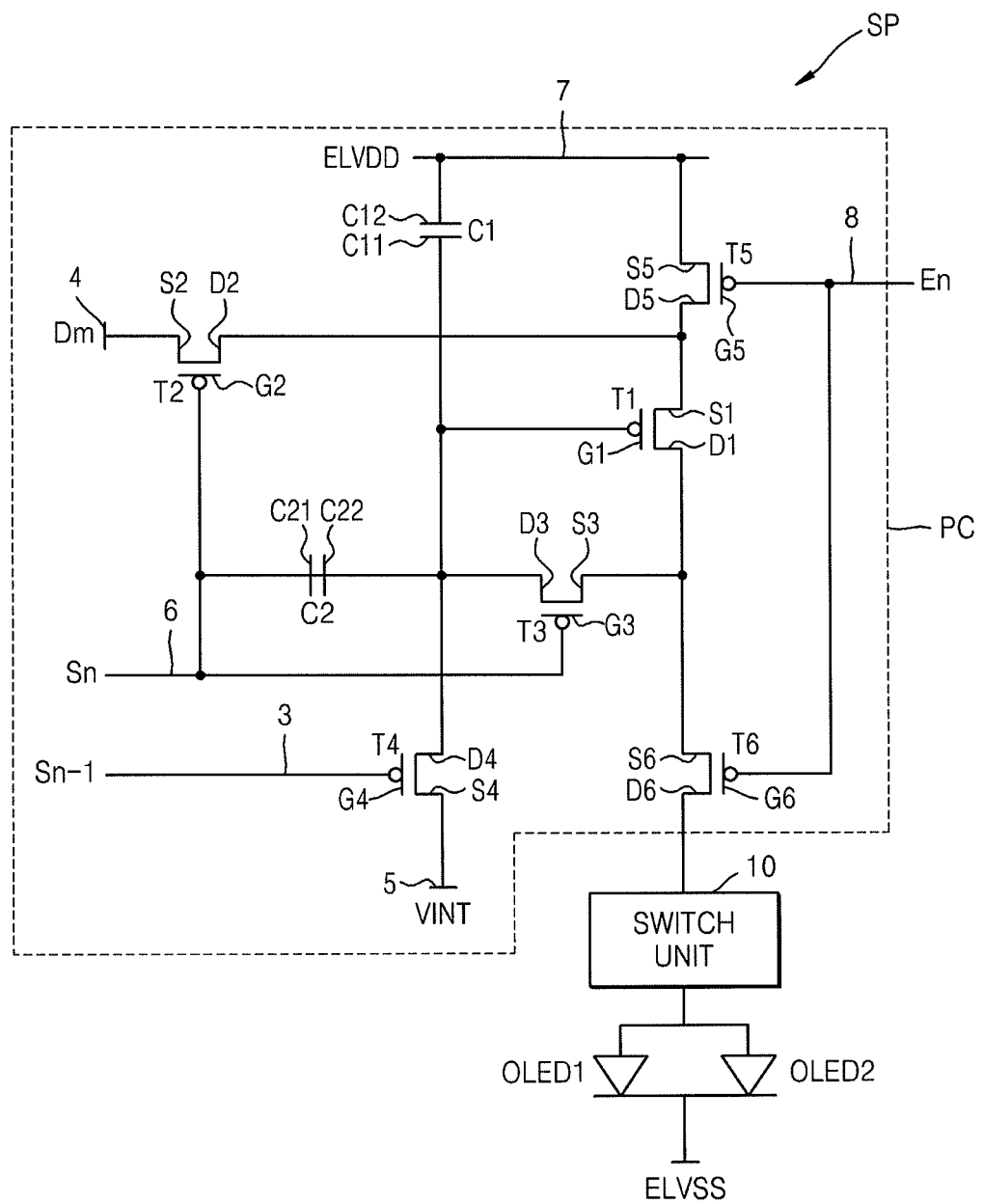

FIG. 14 is an equivalent circuit diagram of another embodiment of sub-pixel SP. The sub-pixel in FIG. 14 is similar to the sub-pixel SP in FIG. 13, except that pixel circuit PC includes a second capacitor C2. The second capacitor C2 includes a first electrode C21 connected to the gate electrode G2 of the switching TFT T2, and a second electrode C22 connected to the drain electrode D3 of the compensation TFT T3. While FIGS. 13 and 14 show examples of two sub-pixel configurations, the sub-pixels may have a different arrangement (e.g., with a different number of TFTs and/or capacitors) in other embodiments.

In accordance with one or more embodiments, even when a short occurs between one of a plurality of anode electrodes of a sub-pixel and a cathode electrode, or when a defect occurs in an organic layer in one of a plurality of anode electrodes of a sub-pixel (e.g., due to a foreign substance), only the corresponding short anode electrode does not emit light. The other anode electrode(s) and the same adjacent sub-pixel normally emit light. Therefore, visual recognition of a pixel defect caused by the short may not be possible, thus preventing black spots or luminance degradation of pixels. This allows for defective sub-pixels in an organic light-emitting display to be easily compensated for, thereby producing images which are not noticeably degraded.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting display, comprising:
a pair of first sub-pixels of a first color arranged adjacent to one another in different rows and corresponding to different unit pixels;
a pair of second sub-pixels of a second color adjacent to one another in different rows and corresponding to different unit pixels, the pair of first sub-pixels and the pair of second sub-pixels arranged alternately in a first column; and
third sub-pixels of a third color in a second column adjacent to the first column, wherein each third sub-pixel includes a light-emitting diode and a pixel circuit connected to the light-emitting diode, and each of the first sub-pixel and the second sub-pixel including:
a plurality of light-emitting diodes, each of which includes an anode electrode and a cathode electrode;
a pixel circuit to be selectively connected to at least one of the plurality of light-emitting diodes; and a switch circuit between the pixel circuit and the plurality of light-emitting diodes, wherein the switch circuit of the first sub-pixel in the first row is to selectively connect the pixel circuit of the first sub-pixel in the first row to at least one of the light-emitting diodes of the first sub-pixel in the first row and at least one of a plurality of light-emitting diodes of the first sub-pixel in the second row adjacent to the first row according to a state of the plurality of light-emitting diodes of the first sub-pixel in the first row, and wherein the switch circuit of the second sub-pixel in the first row is to selectively connect the pixel circuit of the second sub-pixel in the first row to at least one of the light-emitting diodes of the second sub-pixel in the first row and at least one of a plurality of light-emitting diodes of the second sub-pixel in the second row according to a state of the plurality of light-emitting diodes of the second sub-pixel in the first row.

2. The display as claimed in claim 1, wherein the switch circuit of the first sub-pixel of the first unit pixel in the first row comprises:
a first switch circuit between the pixel circuit of the first sub-pixel in the first row to the light-emitting diodes of the first sub-pixel in the first row; and
a second switch circuit between the pixel circuit of the first sub-pixel in the first row to the light-emitting diodes of the first sub-pixel of the second unit pixel in the second row, and
wherein the switch circuit of the second sub-pixel of the first unit pixel in the first row comprises:
a first switch circuit between the pixel circuit of the second sub-pixel in the first row to the light-emitting diodes of the second sub-pixel in the first row; and
a second switch circuit between the pixel circuit of the second sub-pixel in the first row to the light-emitting diodes of the second sub-pixel of the second unit pixel in the second row.

3. The display as claimed in claim 2, wherein:
the first switch circuit of the first sub-pixel in the first row includes multiple switches to selectively connect the pixel circuit of the first sub-pixel in the first row to at least one of the anode electrodes of the light-emitting diodes of the first sub-pixel in the first row, and
the second switch circuit of the first sub-pixel in the first row includes multiple switches to selectively connect the pixel circuit of the first sub-pixel in the first row to at last one of the anode electrodes of the light-emitting diodes of the first sub-pixel in the second row, and
wherein the first switch circuit of the second sub-pixel in the first row includes multiple switches to selectively connect the pixel circuit of the second sub-pixel in the first row to at least one of the anode electrodes of the light-emitting diodes of the second sub-pixel in the first row, and
the second switch circuit of the second sub-pixel in the first row includes multiple switches to selectively connect the pixel circuit of the second sub-pixel in the first row to at least one of the anode electrodes of the light-emitting diodes of the second sub-pixel in the second row.

4. The display as claimed in claim 3, wherein the multiple switches are PMOS transistors.

5. The display as claimed in claim 3, wherein the multiple switches are NMOS transistors.

6. The display as claimed in claim 2, wherein:
the light-emitting diodes include a first light-emitting diode which includes a first anode electrode and a common cathode electrode, and a second light-emitting diode which includes a second anode electrode and the common cathode electrode.

7. The display as claimed in claim 6, wherein:
when the first light-emitting diode of the first sub-pixel in the first row is defective, and
the first switch circuit of the first sub-pixel in the first row connects the pixel circuit of the first sub-pixel in the first row to the second light-emitting diode of the first sub-pixel in the first row and the second switch circuit connects the pixel circuit of the first sub-pixel in the first row to one of a first light-emitting diode or a second light-emitting diode of the first sub-pixel in the second row.

8. The display as claimed in claim 6, wherein:
when both the first light-emitting diode and the second light-emitting diode of the first sub-pixel in the first row are defective, and
the second switch circuit of the first sub-pixel in the first row connects the pixel circuit of the first sub-pixel in the first row to a first light-emitting diode and a second light-emitting diode of the first sub-pixel in the second row.

9. The display as claimed in claim 7, wherein the second light-emitting diode of the first sub-pixel in the first row and the one of the first light-emitting diode or the second light-emitting diode of the first sub-pixel in the second row connected to the second switch circuit are controlled to emit light at a same time.

10. The display as claimed in claim 1, wherein the third sub-pixel has a height that is substantially twice or more than a height of the first sub-pixel or the second sub-pixel in a column direction.

11. The display as claimed in claim 1, wherein:
the first sub-pixels emit red light,
the second sub-pixels emit green light, and
the third sub-pixels emit blue light.

12. An organic light-emitting display, comprising:
a sub-pixel in a first row which includes:
a plurality of first light-emitting diodes;
a first pixel circuit to output a driving current;
a first switch circuit between the first pixel circuit and the plurality of first light-emitting diodes, the first switch circuit to selectively connect the first pixel circuit to at least one of the plurality of first light-emitting diodes to transmit a driving current from the first pixel circuit to at least one of the plurality of first light-emitting diodes; and
a second switch circuit between the first pixel circuit and a plurality of second light-emitting diodes of a sub-pixel of a same color in a second row adjacent to the first row, the second switch circuit to selectively connect the first pixel circuit to at least one of the plurality of second light-emitting diodes to transmit the driving current from the first pixel circuit to at least one of the plurality of second light-emitting diodes.

13. The display as claimed in claim 12, further comprising:
a plurality of pixels, each pixel including a first sub-pixel of a first color, a second sub-pixel of a second color and a third sub-pixel of a third color, wherein:
a pair of the first sub-pixels are arranged consecutively in different rows, and a pair of the second sub-pixels are arranged consecutively in different rows, the pair of first sub-pixels and the pair of second sub-pixels are arranged alternately in a first column, and the third sub-pixel is arranged in a second column adjacent to the first column, wherein the sub-pixel is the first sub-pixel or the second sub-pixel.

14. The display as claimed in claim 12, wherein:

the first switch circuit includes multiple first switching elements between the first pixel circuit and the first light-emitting diodes, and the second switch circuit includes multiple second switching elements between the first pixel circuit and the second light-emitting diodes.

15. The display as claimed in claim 14, wherein the multiple switching elements are PMOS transistors.

16. The display as claimed in claim 14, wherein the multiple switching elements are NMOS transistors.

17. The display as claimed in claim 14, wherein:

when one of the first light-emitting diodes is defective, a first switching element connected to the defective first light-emitting diode is turned off, and remaining ones of the first switching elements are turned on to connect the pixel circuit to remaining ones of the first light-emitting diodes and one of the second switching elements are turned on to connect the pixel circuit to one of the second light-emitting diodes.

18. The display as claimed in claim 14, wherein:

when all of the first light-emitting diodes are defective, the first switching elements are turned off and the second switching elements are turned on.

19. The display as claimed in claim 12, wherein:

the first sub-pixel emits red light;

the second sub-pixel emits green light; and the third sub-pixel emits blue light.

* * * * *